United States Patent
Yang

(10) Patent No.: US 10,634,822 B2
(45) Date of Patent: Apr. 28, 2020

(54) METHOD OF MANUFACTURING A MOTH EYE MIRCOSTRUCTURE, AN ANTIREFLECTIVE SUBSTRATE AND AN ELECTRONIC PRODUCT

(71) Applicant: Wuhan China Star Optoelectronics Technology Co., Ltd., Wuhan, Hubei (CN)

(72) Inventor: Yong Yang, Guangdong (CN)

(73) Assignee: Wuhan China Star Optoelectronics Technology Co., Ltd., Wuhan, Hubei (CN)

(*) Notice: Subject to any disclaimer, the term of this patent is extended or adjusted under 35 U.S.C. 154(b) by 279 days.

(21) Appl. No.: 15/552,950

(22) PCT Filed: Jun. 28, 2017

(86) PCT No.: PCT/CN2017/090497
§ 371 (c)(1),
(2) Date: Aug. 23, 2017

(87) PCT Pub. No.: WO2018/218720
PCT Pub. Date: Dec. 6, 2018

(65) Prior Publication Data
US 2018/0348410 A1    Dec. 6, 2018

(51) Int. Cl.
*G02B 1/118*    (2015.01)
*C23C 16/02*    (2006.01)
(Continued)

(52) U.S. Cl.
CPC .......... *G02B 1/118* (2013.01); *C23C 16/0236* (2013.01); *C23C 16/0245* (2013.01);
(Continued)

(58) Field of Classification Search
CPC ... G02B 1/118; G02B 1/113; H01L 21/31122; H01L 21/3065; C23C 16/0245; C23C 16/0236
See application file for complete search history.

(56) References Cited

U.S. PATENT DOCUMENTS

2008/0278811 A1*  11/2008  Perkins ............... G02B 5/3058
                                                   359/485.05
2011/0147703 A1    6/2011  Tansu et al.
(Continued)

FOREIGN PATENT DOCUMENTS

CN    102403420 A    4/2012
CN    103311386 A    9/2013
(Continued)

OTHER PUBLICATIONS

Translation of CN103311386A, Zhang et al., 2013.*

*Primary Examiner* — Duy Vu N Deo
(74) *Attorney, Agent, or Firm* — Andrew C. Cheng

(57) ABSTRACT

The present invention provides a method of manufacturing a moth eye microstructure, an antireflective substrate, and an electronic product, and relates to display field. The method includes providing a substrate; forming a metal film layer on the substrate; etching the metal film layer to form a moth eye antireflective microstructure pattern; and oxidizing the metal film layer to form the moth eye antireflective microstructure on the substrate. The present invention can be etched to form the ideal microstructure contour and aspect ratio through the method above. The moth eye microstructure having high aspect ratio is formed.

5 Claims, 3 Drawing Sheets

(51) Int. Cl.
  *H01L 21/3065* (2006.01)
  *H01L 21/311* (2006.01)
  *G02B 1/113* (2015.01)
(52) U.S. Cl.
  CPC .... *H01L 21/3065* (2013.01); *H01L 21/31122*
  (2013.01); *G02B 1/113* (2013.01)

(56) References Cited

U.S. PATENT DOCUMENTS

2013/0043956 A1* 2/2013 Salit ................... G02B 5/3058
                                                    331/94.1
2016/0299260 A1* 10/2016 Ibuki ..................... G02B 1/118
2017/0197202 A1* 7/2017 Koo ........................ B01J 21/04

FOREIGN PATENT DOCUMENTS

| CN | 103337575 A | 10/2013 |
| CN | 104846336 A | 8/2015 |
| JP | 2006065205 A | 3/2006 |

\* cited by examiner

METHOD OF MANUFACTURING A MOTH EYE MIRCOSTRUCTURE, AN ANTIREFLECTIVE SUBSTRATE AND AN ELECTRONIC PRODUCT

BACKGROUND

Technical Field

The present invention relates to display field, and more particularly, to a method of manufacturing a moth eye microstructure, an antireflective substrate and an electronic product.

Description of Related Art

With development of electronic message technique, there are more and more electronic devices utilized in people lives such as cell phones, tablets, laptops, and LCD. People usually use these electronic devices in high intensity environment and the display devices can generate flare, reflective light, or ghost so it disturbs people reading. In the conventional technique, antireflection and antiflare process is performed on the cap panel of the display device to solve this problem. Forming a moth eye microstructure on the surface of the cap panel can reduce effectively reflectivity thereof and improve readability.

The inventor of the present invention in long term research finds that the present cap panel includes a glass cap panel and a sapphire cap panel. Hardness, scratch, durability, and touch accuracy of the sapphire cap panel is better than that of the glass cap panel so the sapphire cap panel is gradually applied to the display device. Because sapphire is hard, the requirement of manufacturing moth eye microstructure on the surface thereof is strict. Etch selectivity of the sapphire is not high so it is hard to manufacture the moth eye microstructure of high aspect ratio and the application of the sapphire cap panel is restricted.

SUMMARY

The main technique problem that the present invention need to solve is to provide a method of manufacturing a moth eye microstructure, an antireflective substrate and an electronic product. The moth eye microstructure having high aspect ratio is formed.

For solving the problem above, the present invention adopts another embodiment that provides an antireflective substrate including: a sapphire substrate which is laminated and has the same material; an antireflective layer including a moth eye antireflective microstructure pattern which is formed through chemical reaction; and wherein aspect ratio of the moth eye antireflective microstructure pattern is 0.1~1.2.

For solving the problem above, the present invention adopts another embodiment that provides an electronic product including an antireflective substrate including a substrate which is laminated and has the same material, and an antireflective layer including a moth eye antireflective microstructure pattern which is formed through chemical reaction.

For solving the problem above, the present invention adopts an embodiment that provides a method of manufacturing a moth eye antireflective microstructure, comprising steps of: providing a substance; forming a metal film layer on the substrate; etching the metal film layer to form a moth eye antireflective microstructure pattern; and oxidizing the metal film layer to form the moth eye antireflective microstructure on the substance.

The benefit of the present invention is to form a metal film layer on a substrate and etch the metal film layer to form a moth eye antireflective microstructure pattern, distinguishing from the conventional art. The metal film layer is easy to be etched to form the ideal microstructure contour and aspect ratio because the metal film layer is relatively soft and has large etch selectivity. The moth eye microstructure having high aspect ratio is formed.

BRIEF DESCRIPTION OF THE DRAWINGS

The accompanying drawings are included to provide easy understanding of the application, are incorporated herein and constitute a part of this specification. The drawings illustrate embodiments of the application and, together with the description, serve to illustrate the principles of the application.

DESCRIPTION OF THE PREFERRED EMBODIMENTS

To better and concisely explain the disclosure, the same name or the same reference number given or appeared in different paragraphs or figures along the specification should has the same or equivalent meanings while it is once defined anywhere of the disclosure. In the case of no conflict, the following embodiments and the features thereof can be combined with each other.

Figure 1:
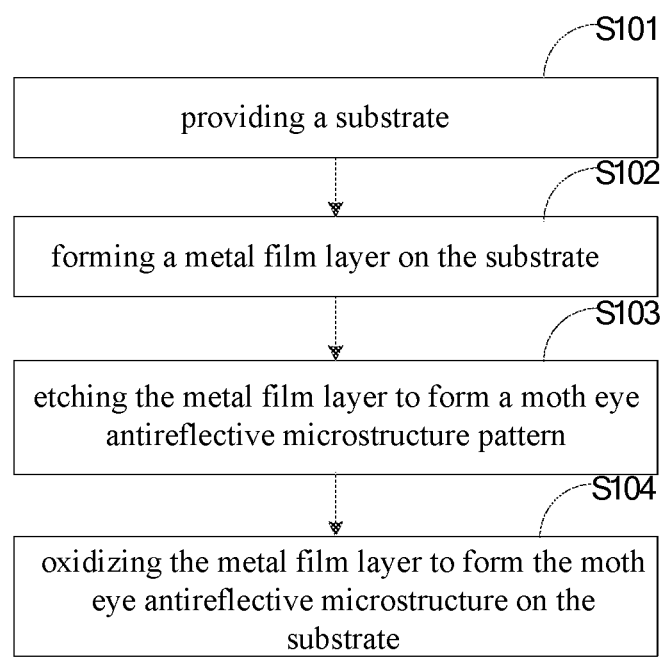
FIG. 1 is a flow chart of a method of manufacturing a moth eye antireflective microstructure in accordance with an embodiment of the present invention.

Referring FIG. 1, FIG. 1 is a flow chart of a method of manufacturing a moth eye antireflective microstructure in accordance with an embodiment of the present invention.

S101: providing a substrate.

The substrate can be a sapphire substrate or the substrate of other material according to difference of the optical element material.

S102: forming a metal film layer on the substrate.

The metal film layer oxidized to form a metal oxide of which material is the same as or similar to the substrate material. Optionally, it can adopt evaporation or magnetron sputtering to form the metal film layer.

S103: etching the metal film layer to form a moth eye antireflective microstructure pattern.

Optionally, it can adopt Inductively Coupled Plasma (ICP) or Reactive-Ion Etching (RIE) to etch the metal film layer.

S104: oxidizing the metal film layer to form a moth eye antireflective microstructure.

Optionally, it can adopt calcination to oxidize the metal film layer. The metal film layer can be oxidized to form a metal oxide of which material is the same as or similar to the substrate material. The material of the moth eye antireflective microstructure is the same as or similar to the substrate material. Further, the metal oxide after oxidation is harder so the microstructure includes better rubbing fastness.

In this embodiment, the metal film layer is formed on the substrate and etched to form the ideal microstructure contour and aspect ratio because the metal film layer is relatively soft and has large etch selectivity. The moth eye microstructure having high aspect ratio is formed.

Figure 2:
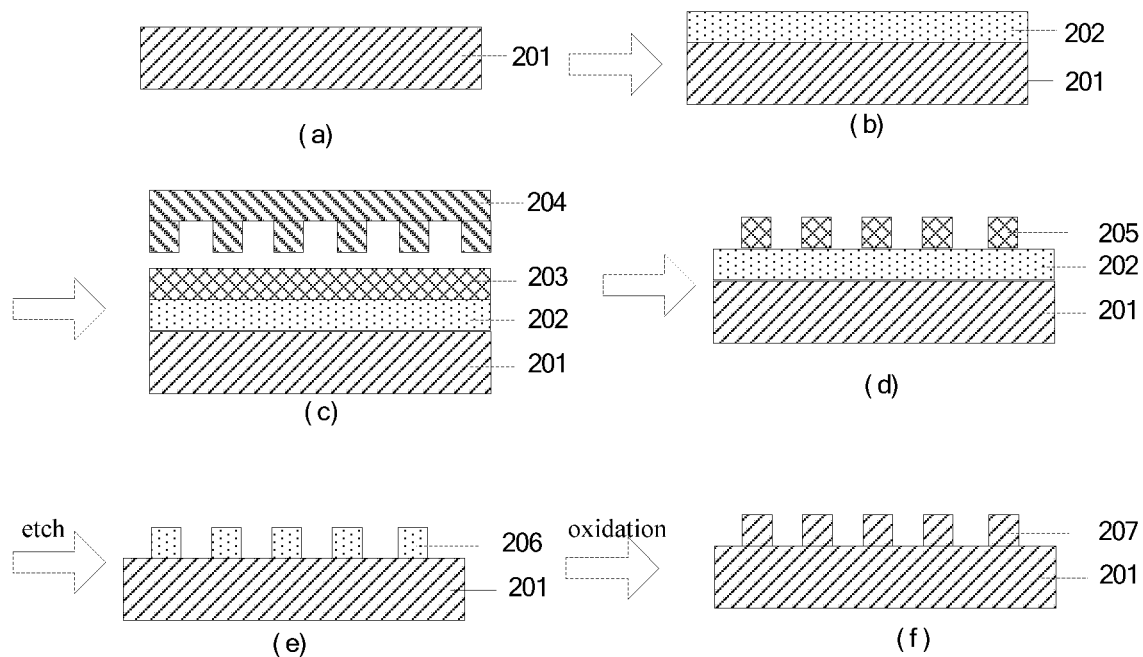
FIG. 2 is a flow chart of a method of manufacturing a moth eye antireflective microstructure in accordance with an embodiment of the present invention.

Referring to FIG. 2, FIG. 2 is a flow chart of a method of manufacturing a moth eye antireflective microstructure in accordance with an embodiment of the present invention. In this embodiment, the substrate is a sapphire substrate and the metal film layer is an aluminum film layer. In another embodiment, the substrate can be other materials and the metal film layer includes the corresponding material.

A metal film layer 202 is formed on a clean substrate 201. Material of the metal film layer 202 selects metal which is similar to that of the substrate 201 so it can enhance the binding force between the substrate 201 and the metal film layer 202 and is not easy to peel. The material of the metal film layer 202 can form a metal oxide which is the same as or similar to that of the substrate 201 after oxidation and form a moth eye antireflective microstructure of which material is the same as or similar to that of the substrate 201.

Thickness of the metal film layer 202 is at micron scale. Specifically, it can be 200 μm~500 μm. It can be 200 μm, 300 μm, 400 μm, or 500 μm. A surface of the metal film layer 202 is flatter. Optionally, it can adopt evaporation or magnetron sputtering to form the metal film layer. In another embodiment, it can adopt other methods to form the metal film layer.

An imprint resist 203 is formed on the metal film layer 202. Optionally, the imprint resist 203 includes organic material having fluorine such as fluoro snarl s so can avoid viscose during mold release.

An imprint mold 204 imprints the imprint resist 203 and is released to form corresponding pattern 205 such as the structure shown in FIG. (d). The imprint resist 203 is processed in nano scale as a mask. The surface of the metal film layer 202 is etched and the residual imprint resist is clean to form a moth eye microstructure 206 as shown in FIG. (e). The metal film layer 202 is easy to be etched to form the ideal microstructure contour and aspect ratio because the metal film layer 202 is relatively soft and has large etch selectivity. Optionally, it can adopt Inductively Coupled Plasma (ICP) or Reactive-Ion Etching (RIE) to etch the metal film layer 202. In another embodiment, it can adopt other method to etch the metal film layer as well.

The metal film layer 202 is oxidized so a moth eye antireflective microstructure 207 can be formed on the substrate 201. Specifically, the moth eye microstructure 206 of metal material becomes the moth eye antireflective microstructure 207 of metal oxide material after oxidation. Material of the moth eye antireflective microstructure 207 is the same as or similar to that of the substrate 201. The metal oxide after oxidation is harder so the microstructure includes better rubbing fastness. Optionally, it can adopt calcination to oxidize the metal film layer 202. In another embodiment, it can adopt other method to oxidize the metal film layer as well.

Specifically, the process of calcination to oxidize the metal film layer 202 is divided to preheating step and high temperature heating step. The moth eye microstructure 206 of metal material is preheated. The preheating temperature is 400° C.-600° C. It can be 400° C., 450° C., 500° C., 550° C., or 600° C. The preheating time is 20 h-30 h. It can be 20 h, 23 h, 25 h, 28 h, or 30 h. The metal is gradually oxidized to be the metal oxide through preheating. Slow oxidation is benefit that the microstructure becomes a dense structure. Interior of the microstructure can be fully oxidized to be the dense structure through low temperature oxidation. In another embodiment, it can select different preheating temperature and preheating time according to different metal.

It conducts high temperature rapid heating reaction after preheating. The heating temperature is 1000° C.-1200° C. It can be 1000° C., 1050° C., 1100° C., 1150° C., or 1200° C. The heating time is 1 h-2 h. It can be 1 h, 1.2 h, 1.5 h, 1.8 h, or 2 h. The microstructure can fully react through the high temperature rapid heating reaction to reduce defective structures on the surface or inside thereof. In another embodiment, it can select different heating temperature and heating time according to different metal.

Aspect ratio of the moth eye antireflective microstructure 207 is 0.1~1.2 through the method above. It can be 0.1, 0.3, 0.5, 0.8, 1.0, or 1.2. Compared to the conventional art, the moth eye microstructure formed on the substrate through the method above include advantage of short etch time and regular moth eye microstructure, and high aspect ratio.

Figure 3:
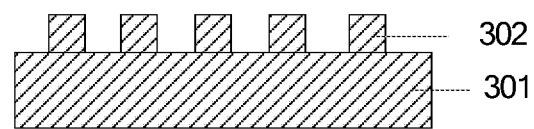
FIG. 3 is a schematic view of an antireflective substrate in accordance with an embodiment of the present invention.
Figure 4:
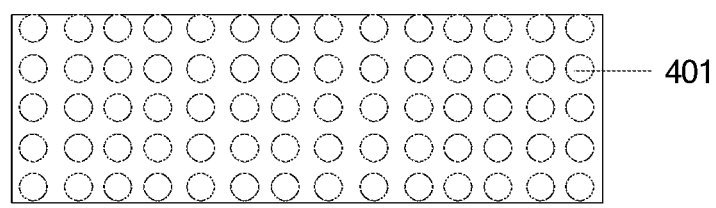
FIG. 4 is a top view of an antireflective substrate in accordance with an embodiment of the present invention.

Referring FIGS. 3 and 4, FIG. 3 is a schematic view of an antireflective substrate in accordance with an embodiment of the present invention, and FIG. 4 is a top view of an antireflective substrate in accordance with an embodiment of the present invention. The present invention provides an antireflective substrate including a substrate 301 which is laminated and has the same material, and an antireflective layer 302. The antireflective layer 302 includes a moth eye antireflective microstructure pattern 401 which is formed through chemical reaction. The moth eye antireflective microstructure pattern of the antireflective substrate is regular and has high aspect ratio, and the manufacturing method thereof is simple.

The chemical reaction is oxidation. The substrate 301 is a sapphire substrate. The antireflective layer 302 is an $Al_2O_3$ layer made of oxidizing an aluminum layer. Thickness of the antireflective layer 302 is 200 μm~500 μm. The aspect ratio of the moth eye antireflective microstructure is 0.1~1.2. The specific manufacturing method can refer related description of the embodiment above. It is not iterated.

Figure 5:
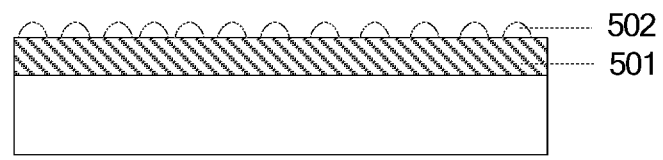
FIG. 5 is a schematic view of an electronic product in accordance with an embodiment of the present invention.

Referring FIG. 5, FIG. 5 is a schematic view of an electronic product in accordance with an embodiment of the present invention. The present invention provides an electronic product including an antireflective substrate 501. The antireflective substrate 501 includes a moth eye antireflective microstructure pattern 502 thereon. It can specifically refer related description of the embodiment above. It is not iterated.

In summary, the present invention provides a moth eye antireflective microstructure pattern by forming a metal film layer on a substrate and etching the metal film layer to form the moth eye antireflective microstructure pattern. The metal film layer is easy to be etched to form the ideal microstructure contour and aspect ratio because the metal film layer is relatively soft and has large etch selectivity. The moth eye microstructure having high aspect ratio is formed.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A method of manufacturing a moth eye antireflective microstructure, comprising steps of:

providing a substrate;

forming a metal film layer on the substrate;

etching the metal film layer to form a moth eye antireflective microstructure pattern; and oxidizing the metal film layer to form the moth eye antireflective microstructure on the substrate, wherein, oxidizing the metal film layer to form the moth eye antireflective microstructure on the substrate comprises oxidizing the metal film layer by calcinations; and oxidizing the metal film layer by calcination comprises:

preheating the metal film layer, wherein preheating temperature is 400° C.-600° C. and preheating time is 20-30 h; and heating the metal film layer with high temperature, wherein heating temperature is 1000° C.-1200° C. and heating time is 1-2 h.

2. The method of claim 1, wherein thickness of the metal film layer is 200 μm~500 μm.

3. The method of claim 1, wherein etching the metal film layer to form the moth eye antireflective microstructure pattern comprises:

forming an imprint resist on the metal film layer; and forming the moth eye antireflective microstructure pattern on the imprint resist.

4. The method of claim 1, wherein the substrate is a sapphire substrate and the metal film layer is an aluminum film layer.

5. The method of claim 1, wherein aspect ratio of the moth eye antireflective microstructure is 0.1~1.2.

\* \* \* \* \*